United States Patent
Marshall et al.

(10) Patent No.: US 7,018,217 B2
(45) Date of Patent: Mar. 28, 2006

(54) STRUCTURALLY INTEGRABLE ELECTRODE AND ASSOCIATED ASSEMBLY AND FABRICATION METHOD

(75) Inventors: Joseph A. Marshall, Seattle, WA (US); David M. Anderson, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/848,655

(22) Filed: May 19, 2004

(65) Prior Publication Data

US 2005/0260870 A1   Nov. 24, 2005

(51) Int. Cl.
*H01R 12/00* (2006.01)
*H05K 1/00* (2006.01)

(52) U.S. Cl. .................. 439/67; 174/117 FF
(58) Field of Classification Search ............ 439/67, 439/492, 495, 931, 34; 174/117 FF, 94 R
See application file for complete search history.

(56) References Cited

U.S. PATENT DOCUMENTS

| | | | |
|---|---|---|---|
| 4,352,142 A | 9/1982 | Olson | 361/218 |
| 4,479,163 A | 10/1984 | Bannink, Jr. et al. | 361/218 |
| 4,502,092 A | 2/1985 | Bannink, Jr. et al. | 361/218 |
| 4,628,402 A | 12/1986 | Covey | 361/218 |
| 4,654,747 A | 3/1987 | Covey | 361/215 |
| 4,727,451 A | 2/1988 | Covey | 361/218 |
| 4,789,918 A | 12/1988 | Bannink, Jr. | 361/218 |
| 4,839,771 A | 6/1989 | Covey | 361/218 |
| 4,866,839 A | 9/1989 | Covey | 29/825 |
| 4,892,626 A | 1/1990 | Covey | 205/130 |
| 4,897,143 A | 1/1990 | Covey | 156/273.9 |
| 4,905,931 A | 3/1990 | Covey | 244/1 A |
| 4,912,594 A | 3/1990 | Bannink, Jr. et al. | 361/218 |
| 4,920,449 A | 4/1990 | Covey | 361/216 |
| 4,971,268 A | 11/1990 | Dobrowski et al. | 244/135 R |
| 5,089,325 A | 2/1992 | Covey | 442/231 |
| 5,483,021 A * | 1/1996 | Saen et al. | 174/117 FF |
| 5,496,970 A * | 3/1996 | Spencer | 174/117 F |
| 5,700,979 A * | 12/1997 | Lewis et al. | 174/117 F |
| 6,000,977 A | 12/1999 | Haake | 439/887 |
| 6,035,084 A | 3/2000 | Haake et al. | 385/49 |
| 6,049,041 A * | 4/2000 | Yoshioka et al. | 174/117 FF |
| 6,452,138 B1 * | 9/2002 | Kochman et al. | 219/549 |

OTHER PUBLICATIONS

Katy Black, et al.; *Using Multi-Axis Grating Strain Sensors To Measure Transverse Strain and transverse Strain Gradients In Composite Materials with Complex Weave Structures*; 7 pages; http://www.bluerr.com/papers/BRR-2002_SPIE_Vol4694_p162.pdf.

* cited by examiner

*Primary Examiner*—Hae Moon Hyeon
(74) *Attorney, Agent, or Firm*—Alston & Bird LLP

(57) ABSTRACT

A structurally integrable electrode, an assembly with an integrated electrode, and an associated method are provided. The electrode is configured to provide an electrically conductive path between nodes of an electrical circuit of a structural member. In particular, the electrode includes at least one conductive tow having a core and a conductive coating thereon. Electrically conductive contacts are connected to the ends of the tow, and at least one dielectric ply extends parallel to the tow to at least partially insulate the tow. Thus, the first and second contacts can be connected to the nodes of the circuit, and the tow can be structurally integrated with the structural member so that the tow provides an electrically conductive path between the nodes.

43 Claims, 5 Drawing Sheets

STRUCTURALLY INTEGRABLE ELECTRODE AND ASSOCIATED ASSEMBLY AND FABRICATION METHOD

FEDERALLY SPONSORED RESEARCH OR DEVELOPMENT

This invention was made with government support under contract number NCC2-9019 awarded by the Rotorcraft Industry Technology Association, Inc. (RITA). The government may have certain rights in this invention.

BACKGROUND OF THE INVENTION

1) Field of the Invention

The present invention relates to electrodes and, in particular, to an elongate electrode that is integrated with a structural member and provides a path of electrical conductivity, for example, for transmitting signals or power through the structural member.

2) Description of Related Art

Electrical devices are often used in conjunction with a structural member. For example, electrical devices such as sensors and actuators can be embedded within, mounted on, or otherwise structurally integrated with the structure of a vehicle such as an airplane, spacecraft, land vehicle, ship, and the like. Other examples of electrical devices mounted in conjunction with a structural member can include machinery, buildings, and the like. The sensors can be used to detect temperature, motion, stress, strain, damage, and the like at different locations throughout the structure. The actuators can be used to adjust various control portions of the structure such as an elevator, rudder, aileron, helicopter rotor, door, or valve. Data generated by the electrical devices is typically communicated via electrical wires from the devices to a computer or other circuit device for processing. Similarly, control signals and electrical power are typically transmitted via electrical wires from the computer, power supply, and/or other circuit device to the actuators and sensors. Thus, a network of wires is often required for controlling and monitoring the electrical devices. Each wire usually includes one or more conductive strands, for example, copper strands, which are covered with an insulative jacket. Parallel wires can be held in groups with bundle fasteners, such as cable tie straps or shrink tubing. Fasteners such as clips, ties, and the like are often used to connect the wires or bundles of wires to the structural member at successive locations along the length of the wires so that the position of the wires is maintained.

In some applications, however, it is difficult or impractical to connect the wires to the structural member. For example, the structural member may not define any interior cavities through which the wires can be passed, and the environmental conditions outside the structural member may be harsh, for example, excessively warm or cold or subject to mechanical stress, moisture, or corrosive agents. Further, in applications where the structural member undergoes significant or repeated mechanical stress, the resulting strains in the wires can break the wires regardless of whether the wires are connected to the structural member.

One illustrative example is a blade of a helicopter rotor, which is rotated quickly around a hub of the rotor. In some cases, it may be desirable to provide wires that extend along the length of the blade, for example, to monitor sensors or control actuators in or on the blade. The wires cannot be connected to the outside of the blade because of the external conditions, e.g., wind, moisture, and the like. Further, the blade undergoes significant stress due to centripetal force when rotated at high speeds. If the wires are not connected successively or continuously along the length of the blade, each wire will also be strained due to the centripetal force that results from the rotation. On the other hand, if the wires are connected to the blade, the wires will be strained at the same rate as the blade. In either case, the stress that results in the wires can break or fatigue the wires, rendering the electrical devices ineffective.

Thus, there exists a need for an electrode device that can be provided in a structural member for transmitting electrical signals or power. The electrode should be capable of being integrated with structural members and functioning in harsh environmental conditions that include strain and temperature variations, moisture, and corrosive agents. The electrode should also be adaptable and formable to structural members without internal passages for wiring. Further, the electrode should resist failure, even when the structural member is subjected to significant or repeated stresses.

BRIEF SUMMARY OF THE INVENTION

The present invention provides a structurally integrable electrode for providing an electrically conductive path between first and second nodes of an electrical circuit of a structural member. The electrode includes at least one conductive tow having a core and a conductive coating thereon. The tow can be formed of a plurality of reinforcement fibers extending in the longitudinal direction of the tow. The tow can include a core formed of a relatively strong material that is coated with a conductive material. Thus, the tow can resist failure, even if stressed, e.g., with the structural member. First and second electrically conductive contacts, which can be formed of fabric that is coated with a conductive metal, are connected to the ends of the tow. At least one dielectric ply extends generally parallel to the tow and electrically insulates the tow between the first and second ends. Thus, the first and second contacts can be connected to the first and second nodes of the circuit, and the tow can be structurally integrated with the structural member so that the tow provides an electrically conductive path between the first and second nodes. Further, the dielectric material can be formed of polyimide film or another dielectric material (non-reinforced or fiber renforced) compatible with the structural member, e.g., so that the electrode adhesive (which can be conductive or nonconductive) used in the electrode may be integrated into the structural member and cured before or during curing of the structural member.

According to another embodiment, the present invention provides an assembly having a structurally integrated electrode. The assembly includes a structural member defining first and second nodes of an electrical circuit, and the electrode is embedded in the structural member to provide an electrically conductive path between the nodes. For example, the structural member can be formed of a composite material that includes a reinforcement material disposed in a matrix material. In some cases, the electrode and/or bonds between the electrode and the rest of the circuit can be cured with the structural member.

According to yet another embodiment, the present invention provides a method of fabricating a structurally integrable electrode for providing an electrically conductive path between first and second nodes of an electrical circuit of a structural member. The method includes providing at least one conductive tow having a core and a conductive coating thereon, the tow extending along a longitudinal direction from a first end to a second end, and the core being formed of a plurality of reinforcement fibers extending in the longitudinal direction of the tow. First and second electrically conductive contacts are connected to the ends of the tow so that each contact can provide an electrical connection between the tow and one of the nodes. At least one dielectric ply is also disposed generally parallel to the tow and at least partially around the tow so that the ply electrically insulates the tow between the first and second ends. The electrode can be disposed in a structural member, e.g., by embedding the electrode in a composite material of the structural member such as by co-curing the electrode and the structural member, with the electrode connected between nodes of the structural member.

BRIEF DESCRIPTION OF THE SEVERAL VIEWS OF THE DRAWINGS

Figure 1:
Figure 2:
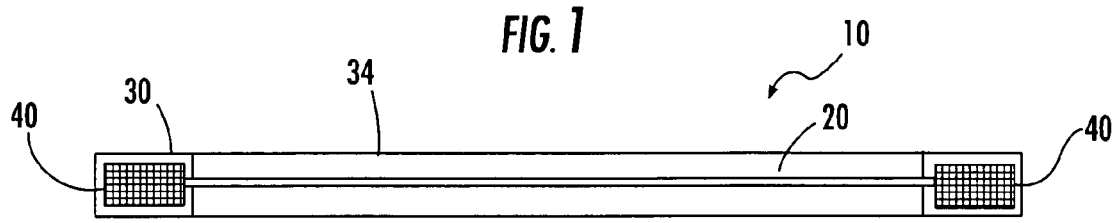
Figure 3:
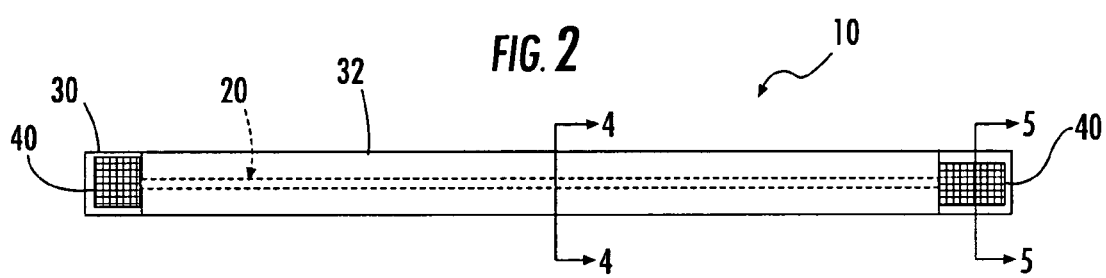
Figure 4:
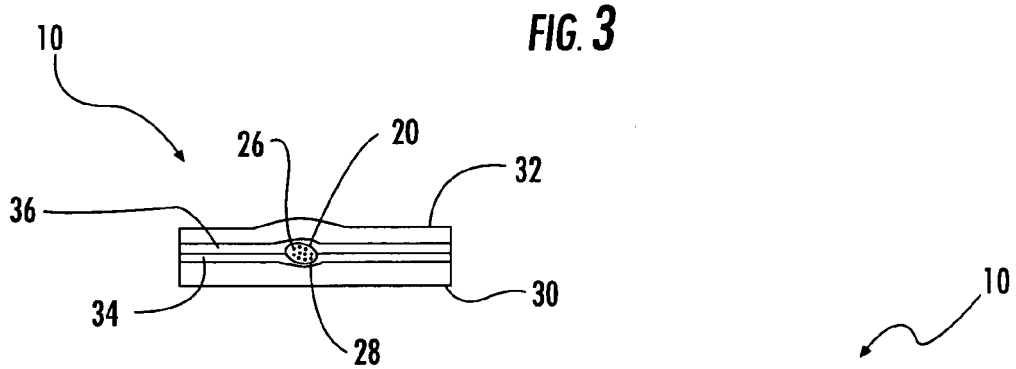
Figure 5:
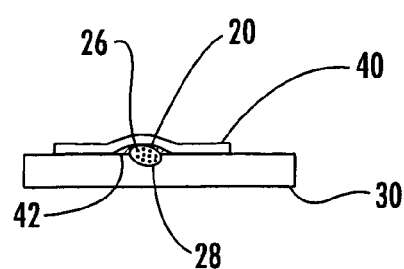
Figure 7:
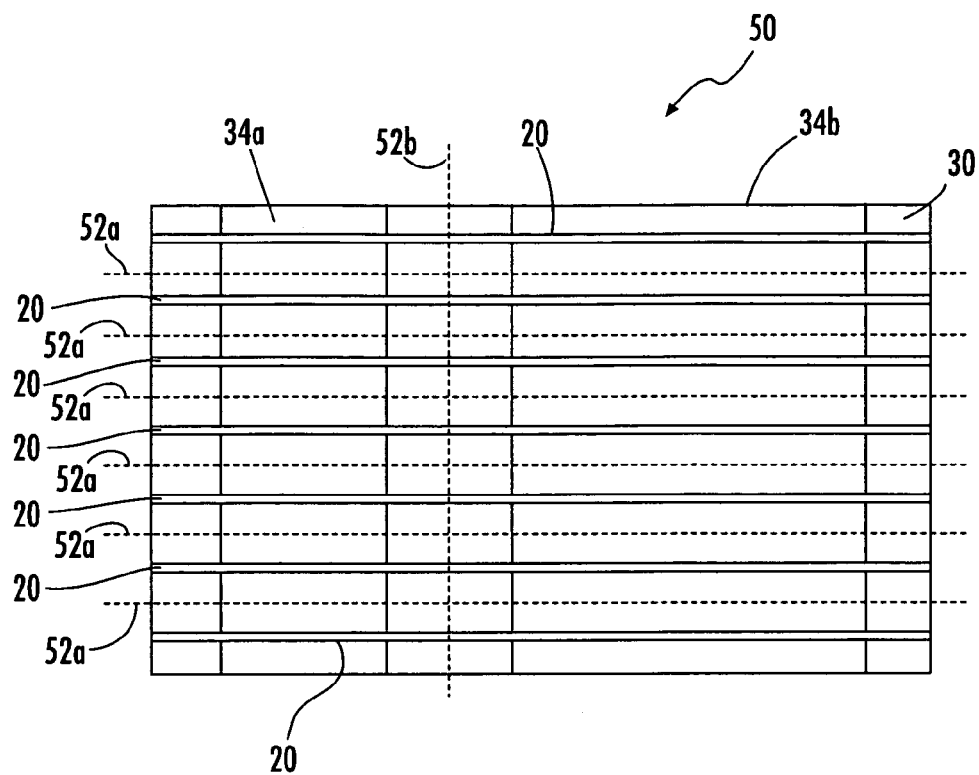
Figure 6:
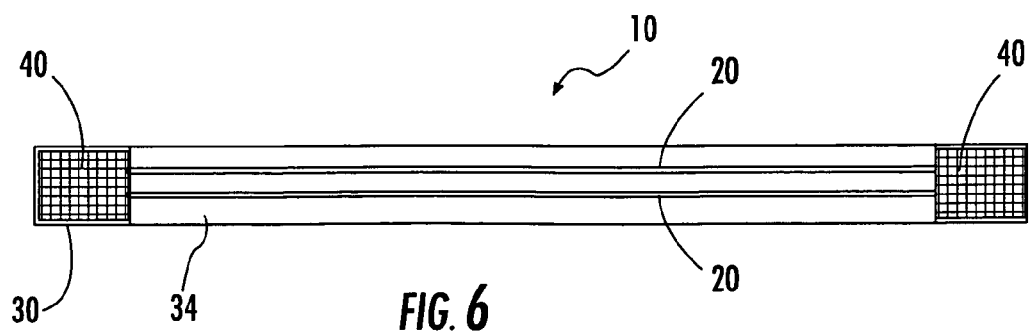
Figure 8:
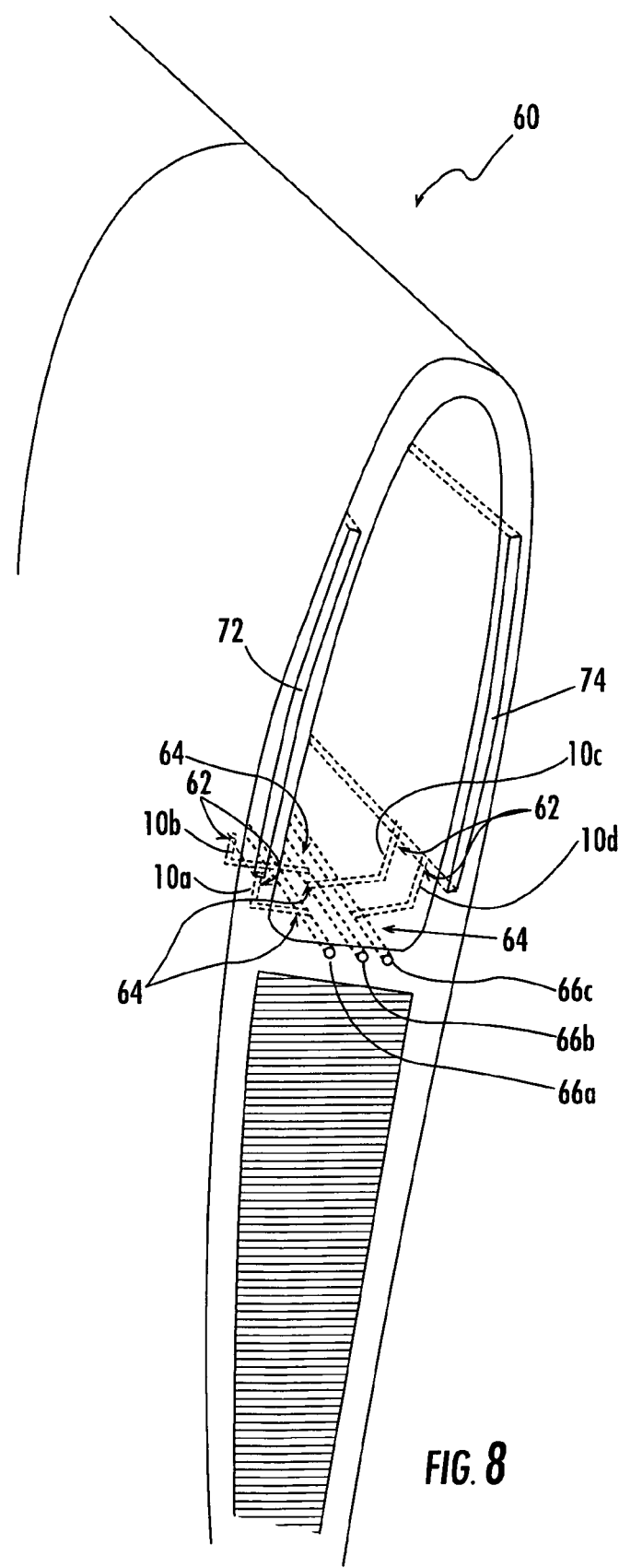
Figure 9:
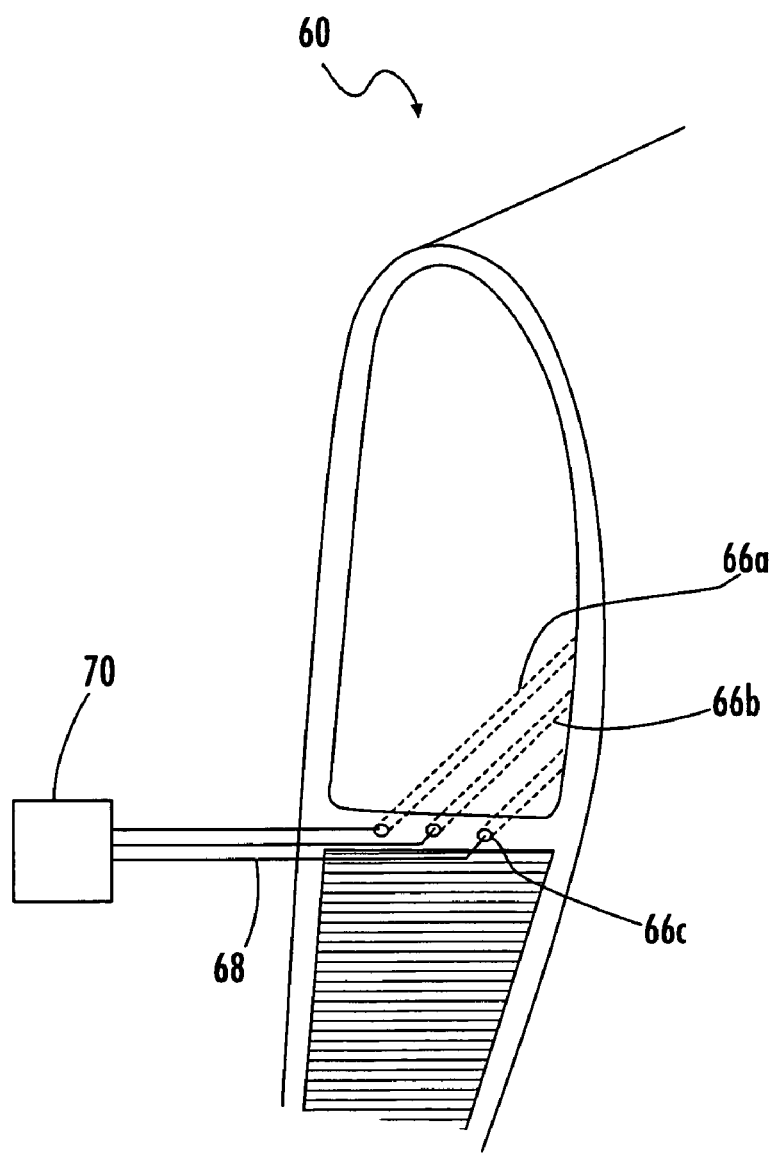
Figure 10:
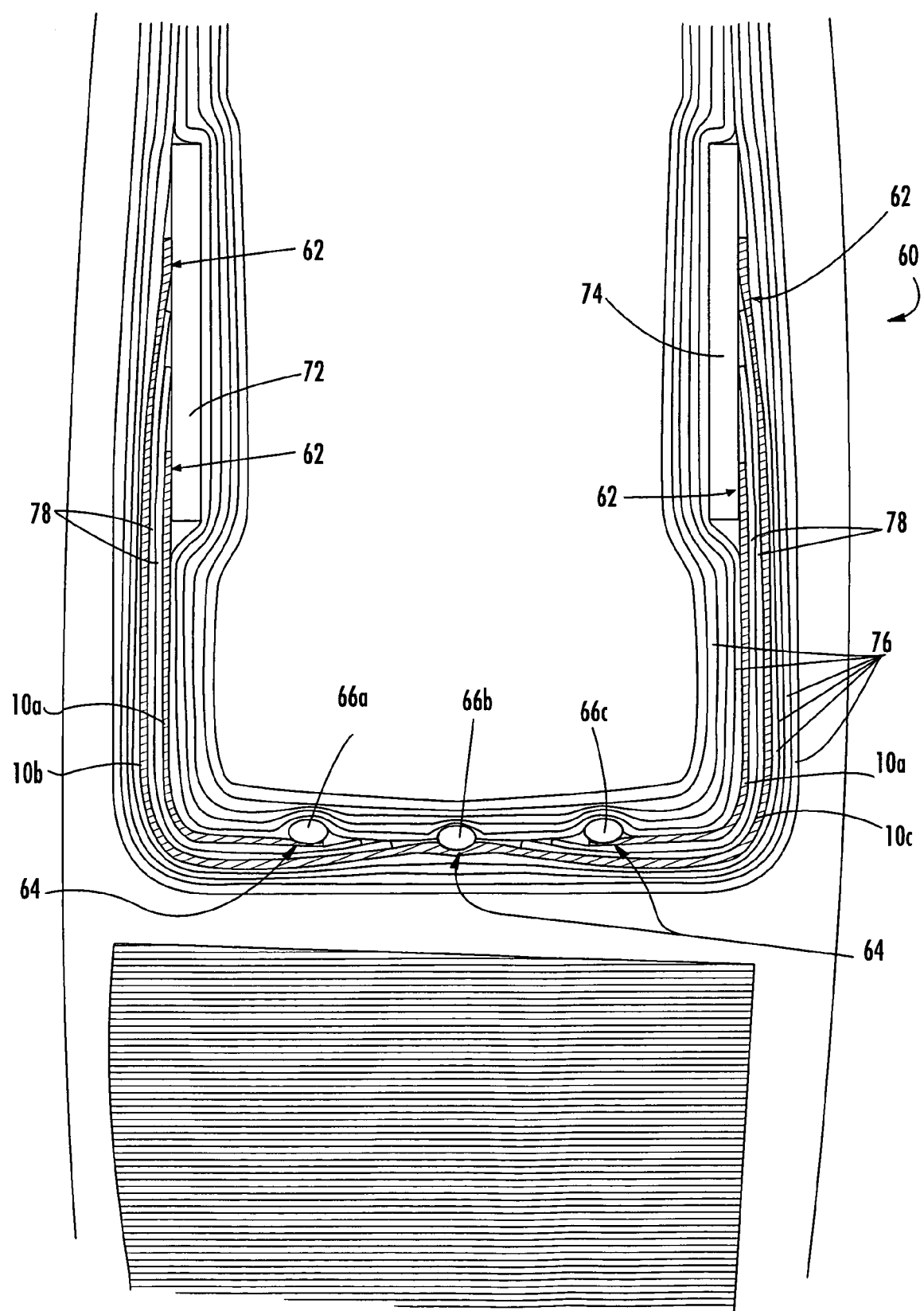

Having thus described the invention in general terms, reference will now be made to the accompanying drawings, which are not necessarily drawn to scale, and wherein:

FIG. 1 is plan view schematically illustrating a structurally integrable electrode during manufacture according to one embodiment of the present invention;

FIG. 2 is a plan view schematically illustrating the structurally integrable electrode of FIG. 1 shown with electrical contacts connected thereto;

FIG. 3 is a plan view schematically illustrating the structurally integrable electrode of FIG. 1 shown with a second dielectric layer disposed thereon;

FIG. 4 is a section view schematically illustrating the structurally integrable electrode of FIG. 1 as seen along line 4-4 of FIG. 3;

FIG. 5 is a section view schematically illustrating the structurally integrable electrode of FIG. 1 as seen along line 5-5 of FIG. 3;

FIG. 6 is a plan view schematically illustrating a structurally integrable electrode including two conductive tows according to another embodiment of the present invention;

FIG. 7 is a plan view schematically illustrating a plurality of structurally integrable electrodes during manufacture according to another embodiment of the present invention;

FIG. 8 is a perspective view schematically illustrating an assembly including a structurally integrated electrode according to one embodiment of the present invention;

FIG. 9 is a perspective view schematically illustrating the assembly of FIG. 8, showing an opposite end of the assembly; and FIG. 10 is a section view schematically illustrating an assembly including a structurally integrated electrode according to yet another embodiment of the present invention.

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

Referring now to the figures, and in particular to FIGS. 1-5, there is shown a structurally integrable electrode 10 during various stages of manufacture according to one embodiment of the present invention. As shown in FIG. 5, the electrode 10 includes a conductive tow 20 that extends along a longitudinal direction of the electrode 10. The tow 20 is disposed on a first dielectric ply 30, and a second dielectric ply 32 can be disposed opposite the tow 20 from the first ply 30 so that the tow 20 is sandwiched between the plies 30, 32. Each of the dielectric plies 30, 32 is configured to electrically insulate at least a portion of the tow 20, and the plies 30, 32 can be formed of a variety of dielectric materials, which can be reinforced or non-reinforced. For example, the plies 30, 32 can be formed of E-glass or quartz glass composite materials, or the plies 30, 32 can be formed of a flexible film, such as Kapton® polyimide film, a registered trademark of E. I. du Pont de Nemours and Company. In some cases, the dielectric plies 30, 32 are provided with a contoured surface, e.g., by plasma etching one or both sides of the plies 30, 32 so that the plies are roughened to facilitate bonding of the plies to the adhesive.

First and/or second layers of adhesive material 34, 36 can also be provided between the plies 30, 32 to secure the tow 20 to the plies 30, 32. In some cases, the dielectric plies 30, 32 are provided with a contoured surface, e.g., by plasma etching one or both sides of the plies 30, 32 so that the plies are roughened to facilitate bonding of the plies to the adhesive. In addition, contacts 40 are electrically connected to opposite ends 22, 24 of the tow 20. Thus, the contacts 40 can be connected to nodes of an electrical circuit so that the electrode 10 provides an electrically conductive path between the nodes.

FIGS. 1–3 illustrate the operations of forming the electrode 10 according to one embodiment of the present invention. As shown, the tow 20 is disposed on the first dielectric ply 30, typically with the layer of adhesive material 34 therebetween. For example, the adhesive material 34 can be an unreinforced thin film adhesive such as FM94 from Cytec Industries Inc. of West Paterson, N.J., or other similar material. Alternative adhesive materials include reinforced or thin film adhesives with or without a carrier. If present, the adhesive, reinforcement material, and carrier are typically insulative dielectric materials. Other adhesive materials can similarly be used. In some cases, the second layer of the adhesive material 36 is provided between the tow 20 and the second ply 32, though one layer of the adhesive material can be sufficient in some cases for securing the plies 30, 32 with the tow 20 therebetween.

The contacts 40 are provided at the ends 22, 24 of the tow 20 and electrically connected thereto. For example, a deformable and/or adhesive conductive material 42 can be applied to the ends 22, 24 of the tow 20 to form the electrical connection between the tow 20 and the respective contact 40. The conductive material 42 can be a conductive epoxy, such as Ablebond® 84-1 LMIT, a registered trademark of National Starch and Chemical Investment Holding Corporation of Wilmington, Del. For purposes of illustrative clarity, the conductive material 42 is shown applied to only one end 22 of the tow 20 in FIG. 1, though the conductive material 42 is typically applied to both ends 22, 24 in order to connect each end 22, 24 of the tow 20 to a respective one of the contacts 40. The contacts 40 can be formed of a variety of materials. According to one embodiment of the present invention, the contacts 40 are formed of pieces of woven fabric, which can be formed of a nonconductive material that is coated with a conductive material. For example, the contacts can be formed of a fabric formed of woven strands of nylon, graphite, Kevlar®, a registered trademark of E. I. du Pont de Nemours and Company, or the like, and the fabric can be coated with conductive materials such as silver, copper, gold, or other metals. The conductive material 42 and the fabric of the contacts can be cured while the electrode 10 is partially assembled, e.g., by oven curing the electrode 10 before the second dielectric ply 32 is disposed thereon.

As shown in FIGS. 2 and 3, the contacts 40 can be smaller than the width of the first dielectric ply 30 so that the ply 30 extends peripherally from each contact 40. In addition, or alternative, the contacts 40 can be configured inward of the longitudinal ends of the first dielectric ply 30 so that the ply 30 extends longitudinally from the contacts 40, as shown in FIGS. 2 and 3. Thus, the electrical contacts 40 can be at least partially insulated by the ply 30 so that the contacts 40 do not make unintended electrical contact with other devices or structures. As shown in FIG. 3, the tow 20 is also insulated by the plies 30, 32. In fact, both of the plies 30, 32 can extend longitudinally to sandwich part of the contacts 40 so that the tow 20 is completely insulated on one side by the first ply 30, and the second ply 32 and the contacts 40 cover the opposite side of the tow 20. As shown in FIGS. 2 and 3, the conductive material 42 and the contacts 40 can be disposed before the second layer of the adhesive material 36 and the second dielectric ply 32.

With the electrode 10 assembled as shown in FIG. 5, the electrode 10 can be cured by heat and pressure to form the electrode 10 as a unified structure. For example, the electrode can be cured in an autoclave according to a temperature and pressure schedule that is conventionally used for curing composite structures. Alternatively, the electrode 10 can be oven cured under vacuum or cured at room temperature. Preferably, the electrode 10 is able to support a subsequent composite cure cycle without the formation of bubbles due to outgassing, and such a composite cure cycle typically occurs at a temperature of between about 250° F. and 350° F. or higher. In some cases, the electrode 10 can be disposed in a vacuum bag, i.e., a bladder that is evacuated, during the curing process. As a result of the curing process, the plies 30, 32 of the electrode 10 are adhered with the tow 20 therebetween, as shown in FIG. 4. While the layers of adhesive material 34, 36 are shown as distinct layers in FIG. 4, the adhesive material may instead be diffused into the plies 30, 32 and the tow 20. In this cured, unified form, the electrode 10 can be easily handled, stored, transported, and disposed in or on a structural member without disturbing the configuration of the electrode 10.

While the electrode illustrated in FIGS. 1–5 includes a single tow 20, the electrode 10 can alternatively include multiple tows 20 in other embodiments of the invention. For example, FIG. 6 illustrates the electrode 10 according to another embodiment of the present invention in which the electrode 10 includes two of the tows 20, each extending generally in the longitudinal direction of the electrode 10. In some cases, additional adhesive, such as the first and second layers of the adhesive material 34, 36, can be provided so that each of the tows 20 is sufficiently wetted by the adhesive. Each tow 20 typically extends between the contacts 40 independently of the other tows 20. That is, typically the tows 20 are not braided, woven, or otherwise interlaced. However, in some cases, the tows 20 can be interlaced. For example, a wire with interlaced tows is further described in U.S. application Ser. No. 10/369,906, filed Feb. 20, 2003, which application is assigned to the assignee of the present application, and which application is incorporated herein in its entirety by reference. As also shown in FIG. 6, the contacts 40 can extend to one or more of the edges of the first ply 30, in which case the contacts 40 may be partially exposed at the edges of the electrode 10. Further, in other cases, the second dielectric ply 32 can be omitted.

Each tow 20 can be formed of a plurality of fibers or filaments 26, as generally illustrated in FIGS. 4 and 5. In some cases, each tow 20 can include thousands of the individual fibers 26, which can be formed of materials including, but not limited to, carbon, graphite, nylon, fiberglass, and aramids such as Kevlar® fibers. The use of tows formed of materials such as carbon or graphite fibers for forming composite materials is known in the art. Carbon fibers and other fibers can be formed according to a variety of methods, which are sufficiently known to those skilled in the art that a description herein is unnecessary for a thorough understanding of the present invention. Typically, the fibers 26 of each tow 20 are arranged generally parallel to each other and extend longitudinally between the ends 22, 24 of the tow 20.

The electrode 10 is electrically conductive such that the electrode 10 can be used for transmitting an electrical signal or electrical power along its length. In particular, a conductive material is provided as a conductive coating 28 on the outer surface of the tow 20, and the core of the tow is formed of a nonconductive, semi-conductive, or conductive material. The conductive coating 28 can include various metals such as silver, nickel, gold, copper, beryllium, aluminum, and alloys thereof. For example, the coating 28 of the conductive material can be disposed on each tow 20 by electroplating, vapor deposition, or other coating methods. In one embodiment, the tow 20 is formed of a metal-plated aramid fiber, e.g., Aracon® fiber, a registered trademark of E.I. du Pont de Nemours and Company, which includes metal-plated Kevlar® fibers. A conductive Aracon® tow can include a plurality of fine metal-clad fibers, such as aromatic polyamides, that are twisted together into a yarn. In other embodiments, the fibers 26 of the tow 20 can be formed of a material, such as carbon, that provides some degree of electrical conductivity. For example, conductive core can be provided for the tow 20 so that the tow 20 is conductive even without the coating 28, and the core can thus provide an alternate path for current flow besides through the coating 28.

FIG. 7 illustrates a manufacturing assembly 50 for forming fourteen of the electrodes 10 according to one embodiment of the present invention. In particular, the assembly 50 includes seven of the tows 20, which are disposed on the first dielectric ply 30. The first layer of the adhesive material 34 is disposed in two portions, indicated by reference numerals 34a, 34b. The assembly 50 can be cut where indicated by dashed lines 52a, 52b to form the individual electrodes 10. In particular, the assembly 50 can be cut along lines 52a so that each tow 20 is separated from the other tows 20, and each electrode includes a single one of the tows 20. As described above in connection with FIG. 6, the electrodes 10 can alternatively include multiple tows 20, e.g., by making fewer than all of the cuts along lines 52a. As indicated by dashed line 52b, the assembly 50 can also be cut to form electrodes 10 of various lengths. In any case, it is appreciated that other assemblies can be formed for manufacturing any number of the electrodes, each electrode having similar or different configurations. Further, additional elements of each electrode 10, such as the conductive material 42, the contacts 40, the second layer of adhesive material 36, the second dielectric ply 32, and the like can be disposed before or after the assembly 50 is cut to form the individual electrodes 10. In any case, the assembly 50 can be cured before or after cutting. Typically, the dielectric plies 30, 32 are disposed in the assembly 50 in combination with the tow 20. That is, the electrode 10 is assembled and then disposed as a single member into the assembly 50.

As illustrated in FIGS. 8 and 9, the electrode 10 can be integrated into a structural member 60 so that the electrode 10 provides a conductive path along the structural member 60 and between nodes 62, 64 of the structural member 60. In this regard, the electrode 10 can be integrated with various types of structural members and, in some cases, multiple structural members of similar or different compositions. The term "structural member" is not meant to be limiting, and the structural member 60 can be a single component or multiple assembled members, for example, building components or machinery. Further, the structural member 60 can be used in any type of structure including vehicles such as aerospace vehicles, aircraft, marine vehicles, automobiles and other land vehicles, and the like. For example, as shown in FIGS. 8 and 9, the structural member 60 is a helicopter rotor blade with three wire buses 66a, 66b, 66c extending along the length of the member 60. The buses 66a, 66b, 66c can be various types of electrical conductors, e.g., woven or braided conductive wires such as are described in U.S. application Ser. No. 10/369,906. As shown in FIG. 9, the buses 66a, 66b, 66c can extend to an end of the structural member 60, and each bus 66a, 66b, 66c can be connected to a circuit device 70 such as a controller mounted in the helicopter. The buses 66a, 66b, 66c can extend to the circuit device 70, or intermediate connection devices 68 such as wires or other conductive elements can be provided therebetween.

Two electrical devices 72, 74 are disposed in the structural member 60, and the electrical devices 72, 74 are electrically connected to the buses 66a, 66b, 66c by electrodes 10a, 10b, 10c, 10d, which are referred to collectively by reference numeral 10. Thus, the circuit device 70 is connected to the electrical devices 72, 74 via the buses 66a, 66b, 66c and electrodes 10a, 10b, 10c, 10d so that the circuit device 70 can monitor, actuate, and/or power the electrical devices 72, 74. In particular, the first bus 66a is connected to the first electrical device 72 by the first electrode 10a. Both of the electrical devices 72, 74 are connected to the second bus 66b by electrodes 10b, 10c, respectively. Electrode 10d connects the third bus 66c to the second electrical device 74. In this configuration, the second bus 66b provides a connection to both electrical devices 72, 74, while the first and third buses 66a, 66c provide independent connections to the respective devices 72, 74.

Each of the electrical devices 72, 74 can be an active or passive electrical device. For example, each electrical device 72, 74 can be an actuator such as a piezo-fiber actuator pack that can be used to provide active aerodynamic control and vibration reduction of the structural member 60. In other embodiments, each of the electrical devices 72, 74 can be a sensor, such a strain gauge that senses deformation in the structural member 60, a light-emitting device, a computer, a processor, a power supply, or any other circuit device. The structural member 60 can include any number of the electrical devices 72, 74, each of which can be controlled independently or in combination. Each electrode 10 can communicate data, transmit control signals, and/or supply power between the electrical devices 72, 74 and the buses 66a, 66b, 66c. The electrodes 10 and/or the buses 66a, 66b, 66c can also provide an electrical ground path for the devices 72, 74. Typically, the electrical devices 72, 74 are also integrated with the structural member 60, e.g., by mounting the devices 72, 74 in or on the structural member 60.

One of the contacts 40 of each electrode 10 can be connected to the respective bus 66a, 66b, 66c by a conductive material such as conductive epoxy that can be cured before or during the curing of the structural member 60. Similarly, conductive epoxy can be used to connect the opposite contact 40 of each electrode 10 to a lead or electrical contact of the respective electrical device 72, 74. Alternatively, the electrodes 10 can be connected by other materials, such as solder, or by a device such as a mechanical connector.

According to one embodiment of the present invention, the structural member 60 is formed of a composite material including fibers or tows that are impregnated with a matrix of a cured resin, and each electrode 10 and/or the buses 66a, 66b, 66c can be structurally integrated with the structural member 60. For example, each electrode 10 can be embedded between the reinforcement materials of a composite structural member. Typically, the electrode is embedded into the structural member 60 before the composite material of the structural member 60 is cured so that as the structural member 60 is cured, the electrode 10 is integrated with the structural member 60 to form a substantially continuous structure. As noted above, the electrode 10 can be cured before or during the curing of the structural member 60. Integration of electrodes, electrical devices, wire buses, and the like is further described in U.S. application Ser. No. 10/848,703, titled "STRUCTURALLY INTEGRATED CIRCUIT AND ASSOCIATED METHOD," filed concurrently herewith, assigned to the assignee of the present application, and which application is incorporated herein in its entirety by reference.

In some cases, the electrode 10 can be partially or completely embedded or encapsulated in the material of the structural member 60. Thus, during operation of the structural member 60, the electrode 10 can be subjected to substantially the same strains as the structural member 60. Typically, the tow 20 of the electrode 10 is formed of a material that is about as strong as, or stronger than, the structural member 60 so that the electrode 10 is unlikely to break or otherwise fail during operation of the structural member 60. For example, the structural member 60 can include reinforcement materials that are the same as the tow 20. In other embodiments, the electrode 10 can be integrated with a structural member formed of other conventional materials including polymers, metals, and the like. Further, the electrode 10 can alternatively be secured to the structural member 60 in other manners, such as by bonding the electrode thereto with adhesive, mechanical connectors, and the like.

As noted above, the electrodes 10, buses 66a, 66b, 66c, and/or the electrical devices 72, 74 can be disposed within the structural member 60. Each of the components 10, 66a, 66b, 66c, 72, 74 can be disposed during the assembly of the structural member 60. For example, as shown in FIG. 10, the structural member 60 can be formed of a composite material having a plurality of layers 76 formed of sheets, tows, fibers, or the like, that are impregnated with a matrix of a thermoset or thermoplastic matrix material such as a resin. The electrodes 10, buses 66a, 66b, 66c, and/or the electrical devices 72, 74 can be disposed during the lay-up of the various layers 76 of the structural member 60, e.g., by laying the components 10, 66a, 66b, 66c, 72, 74 between the layers 76 of the structural member 60 as a stacked layup on a mandrel or other tool and then compressing and curing the structural member 60 with the components therein. As the composite structural member 60 is cured, the electrode 10 is joined to the structural member 60, or integrated with the structural member 60, so that fasteners such as clips are not required. In some cases, multiple electrodes 10 can be layered within the structural member 60, as shown in FIG. 10.

In addition, layers 78 can be disposed adjacent the electrodes 10 for reinforcement and/or insulation. For example, one or more of the layers 78 can be disposed between the electrodes 10a, 10b and between the electrodes 10c, 10d to electrically isolate the respective electrodes 10 and prevent electrical communication therebetween. The layers 78 can be formed of the same reinforcement material of the layers 76 or the same material as the dielectric layers 30, 32 of the electrodes 10. Alternatively, the layers 78 can be formed of a different material, which can be chosen, e.g., to provide a particular electromagnetic shielding between the adjacent electrodes 10. The layers 78 can be any size. For example, according to one embodiment, the layers 78 can correspond in size to the adjacent electrodes 10a, 10b, 10c, 10d so that the layers 78 generally isolate the electrodes 10 but do not extend to positions remote from the electrodes 10. Alternatively, the layers 78 can extend from the electrodes 10, e.g., so that each layer 78 can isolate multiple electrodes 10 disposed along the length of the structural member 60.

The electrode 10 can extend in a generally longitudinal direction between the various nodes 62, 64 of a circuit of the structural member 60, e.g., between the buses 66a, 66b, 66c and the electrical devices 72, 74, so that the electrodes 10 electrically connect the electrical devices 72, 74 to the buses 66a, 66b, 66c. The term "longitudinal" is intended to indicate generally that the electrode 10 extends generally between the two or more nodes 62, 64 that are spaced apart in, though the particular path of the electrode 10 need not be a straight or direct path. That is, each electrode 10 is configured in a predetermined pattern and interconnected into a circuit to obtain the desired performance, and the electrodes 10 can be spaced as necessary to obtain the desired electrical conduction and isolation. For example, as shown in FIGS. 8–10, the integrated electrode 10 may be routed in a nonlinear configuration according to a variety of design factors that are particular to the structural member 60 including, for example, the shape of the structural member 60, the placement of the electrical devices 72, 74, the anticipated variation of stress and strain throughout the structural member 72, 74, and the like. Further, in some cases, more than two of the electrical devices 72, 74 can be connected by the electrode 10, and the devices 72, 74 can also be connected at different locations along the electrode 10.

While the electrode 10 discussed above is described as being electrically conductive, the electrode 10 could alternatively be configured to otherwise conduct or transmit energy. For example, the tow 20 of the electrode 10 can be a fiber optic member that is configured to optically conduct, such that the electrode 10 can be used to transmit light, such as for communicating a signal to and/or from devices disposed throughout the structural member 60. While fiber optic fibers can be disposed in the electrode 10 and subsequently in the structural member 60 in a manner generally similar to that described above, the connections between optic fibers and the buses, devices, and the like are configured to transmit light.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A structurally integrable electrode for providing an electrically conductive path between first and second nodes of an electrical circuit of a structural member, the electrode comprising:
   at least one conductive tow having a core and a conductive coating thereon, the tow extending along a longitudinal direction from a first end to a second end, and the core being formed of a plurality of reinforcement fibers extending in the longitudinal direction of the tow;
   first and second electrically conductive contacts disposed at the first and second ends of the tow, each contact being electrically connected to a respective one of the ends of the tow; and
   at least one dielectric ply extending generally parallel to the tow and at least partially around the tow such that the ply is configured to electrically insulate the tow between the first and second ends,
   wherein the first and second contacts are configured to be connected to the first and second nodes of the circuit and the tow is configured to be structurally integrated with the structural member such that the tow provides an electrically conductive path between the first and second nodes.

2. The electrode according to claim 1 wherein the core of the conductive tow is formed of a nonconductive material.

3. The electrode according to claim 1 wherein the core of the conductive tow is formed of a plurality of generally parallel fibers.

4. The electrode according to claim 1 wherein the fibers of the conductive tow are formed of at least one of the group consisting of aramid, carbon, and graphite.

5. The electrode according to claim 1 wherein the conductive coating of the conductive tow is formed of a metal.

6. The electrode according to claim 1 wherein the dielectric ply comprises a polyimide film.

7. The electrode according to claim 1 wherein first and second dielectric plies are disposed on opposite sides of the tow.

8. The electrode according to claim 1 wherein each contact is disposed on the ply and the ply extends peripherally from each of the contacts.

9. The electrode according to claim 1 wherein each contact comprises fabric coated with a conductive metal.

10. The electrode according to claim 1, further comprising an adhesive disposed between the dielectric ply and the tow.

11. The electrode according to claim 1 wherein the electrode includes a plurality of the tows, each tow extending generally parallel between the first and second contacts.

12. The electrode according to claim 1, further comprising a conductive epoxy disposed between the tow and each contact such that the epoxy provides an electrical connection between the tow and each contact.

13. An assembly having a structurally integrated electrode, the assembly comprising:
   a structural member defining first and second nodes of a circuit;
   an electrode embedded in the structural member for providing a conductive path between the first and second nodes, the electrode comprising:
      at least one conductive tow having a core and a conductive coating thereon, the tow extending along a longitudinal direction from a first end to a second end, and the core being formed of a plurality of reinforcement fibers extending in the longitudinal direction of the tow;

first and second conductive contacts disposed at the first and second ends of the tow, the first contact providing a connection between the first end of the tow and the first node, and the second contact providing a connection between the second end of the tow and the second node; and at least one dielectric ply extending generally parallel to the tow and disposed between the tow and the structural member and configured to insulate the tow from the structural member.

14. The assembly according to claim 13 wherein the structural member is formed of a composite material comprising reinforcement material disposed in a matrix material.

15. The assembly according to claim 13 wherein the ply is cured with the structural member.

16. The assembly according to claim 13 wherein the core of the conductive tow is formed of an electrically nonconductive material.

17. The assembly according to claim 13 wherein the core of the conductive tow is formed of a plurality of generally parallel fibers.

18. The assembly according to claim 13 wherein the fibers of the conductive tow are formed of at least one of the group consisting of aramid, carbon, and graphite.

19. The assembly according to claim 13 wherein the conductive coating of the conductive tow is formed of an electrically conductive metal.

20. The assembly according to claim 13 wherein the dielectric ply comprises a polyimide film.

21. The assembly according to claim 13 wherein first and second dielectric plies are disposed on opposite sides of the tow.

22. The assembly according to claim 13 wherein the each contact is disposed on the ply and the ply extends peripherally from each of the contacts.

23. The assembly according to claim 13 wherein each contact comprises fabric coated with an electrically conductive metal.

24. The assembly according to claim 13, further comprising an adhesive disposed between the dielectric ply and the tow.

25. The assembly according to claim 13 wherein the electrode includes a plurality of the tows, each tow extending generally parallel between the first and second contacts.

26. The assembly according to claim 13, further comprising an electrically conductive epoxy disposed between the tow and each contact such that the epoxy provides an electrical connection between the tow and each contact.

27. The assembly according to claim 1 wherein the structural member is a rotor blade extending in a longitudinal direction and defining an airfoil profile.

28. A method of fabricating a structurally integrable electrode for providing an electrically conductive path between first and second nodes of an electrical circuit of a structural member, the method comprising:

providing at least one conductive tow having a core and a conductive coating thereon, the tow extending along a longitudinal direction from a first end to a second end, and the core being formed of a plurality of reinforcement fibers extending in the longitudinal direction of the tow;

connecting first and second electrically conductive contacts to the first and second ends of the tow such that the first contact is configured to provide an electrical connection between the first end of the tow and the first node and the second contact is configured to provide an electrical connection between the second end of the tow and the second node; and disposing at least one dielectric ply generally parallel to the tow at least partially around the tow such that the ply is configured to electrically insulate the tow between the first and second ends.

29. The method according to claim 28, further comprising disposing the electrode in a structural member defining first and second nodes of an electrical circuit and connecting each of the contacts to one of the nodes such that the electrode provides an electrically conductive path between the nodes.

30. The method according to claim 29, further comprising embedding the electrode in a composite material of the structural member.

31. The method according to claim 30 wherein said embedding step comprises curing the ply with the composite material of the structural member.

32. The method according to claim 28 wherein said providing step comprises forming the core of the conductive tow of a nonconductive material.

33. The method according to claim 28 wherein said providing step comprises forming the tow of a plurality of generally parallel fibers.

34. The method according to claim 28 wherein said providing step comprises forming the fibers of the conductive tow of at least one of the group consisting of aramid, carbon, and graphite.

35. The method according to claim 28 wherein said providing step comprises coating the fibers of the tow with a conductive metal.

36. The method according to claim 28 wherein said disposing step comprises disposing a polyimide film.

37. The method according to claim 28 wherein said disposing step comprises disposing first and second dielectric plies on opposite sides of the tow.

38. The method according to claim 28 wherein said connecting and disposing steps comprises disposing each of the contacts on the ply with the ply extending peripherally from each of the contacts.

39. The method according to claim 28 wherein said connecting step comprises coating fabric with a conductive metal to form the contacts.

40. The method according to claim 28, further comprising disposing an adhesive between the dielectric ply and the tow.

41. The method according to claim 28 wherein said providing step comprises providing a plurality of the tows, each tow extending generally parallel between the first and second contacts.

42. The method according to claim 28, further comprising disposing a conductive epoxy between the tow and each contact such that the epoxy provides an electrical connection between the tow and each contact.

43. The method according to claim 28, further comprising plasma etching a surface of the ply directed toward the tow.

* * * * *